United States Patent [19]

Van Den Haak

[11] 3,974,441
[45] Aug. 10, 1976

[54] BATTERY CHECKER
[75] Inventor: Johannes Van Den Haak, Indianapolis, Ind.
[73] Assignee: Curtis Dyna Products, Corporation, Westfield, Ind.
[22] Filed: June 25, 1975
[21] Appl. No.: 590,097

[52] U.S. Cl. ................................ 324/29.5; 324/96; 320/48; 340/253 A; 307/235 R
[51] Int. Cl.² ........................................ G01N 27/42
[58] Field of Search ............ 324/29.5, 96, 122, 133; 320/48; 340/253 A; 307/235 R

[56] References Cited
UNITED STATES PATENTS
| | | | |
|---|---|---|---|
| 3,818,495 | 6/1974 | Sagara | 324/122 |
| 3,921,064 | 11/1975 | Mori | 324/29.5 |

*Primary Examiner*—R. V. Rolinec
*Assistant Examiner*—Michael J. Tokar
*Attorney, Agent, or Firm*—Woodard, Weikart, Emhardt & Naughton

[57] ABSTRACT

Disclosed is a device for checking the energy level of a battery, or battery pack, of the type used in the powering of transmitters, receivers and servos used in powered model airplanes, boats, cars, etc. The circuit connects a silicon controlled rectifier (SCR) and two light emitting diodes (LED) so that the diodes give a no, no-go indication of the battery's available output compared to a predetermined standard. Initially, in the checking procedure, the battery has power withdrawn through a load resistor prior to the final go, no-go indication.

5 Claims, 2 Drawing Figures

BATTERY CHECKER

BACKGROUND OF THE INVENTION

The hand-held transmitters or control units and the remote receivers and servos used with them in the control of slave devices such as powered model airplanes, boats, cars and the like all utilize batteries, or battery packs, usually of the nickel-cadmium cell type. It is a characteristic of these batteries that on a momentary voltage check, without a short, preceding power drain, they exhibit a satisfactory voltage level. However, on a subsequent power drain of even short duration the voltage level may fall substantially.

The battery checking device of the present invention measures both the voltage and current, the energy level, of the battery and is thus particularly adapted for checking nickel-cadmium battery cells. The circuit is relatively simple in configuration and utilizes diodes and an SCR switching element and thus has no moving parts. No external batteries or power source for the checker is required and a means is provided for adjustably adapting the checker for various battery voltages within a predetermined range. The device is small, pocket size, and plugs directly into the battery to be checked without requiring that the battery be removed from the model.

DESCRIPTION OF THE PREFERRED EMBODIMENT

Figure 1:
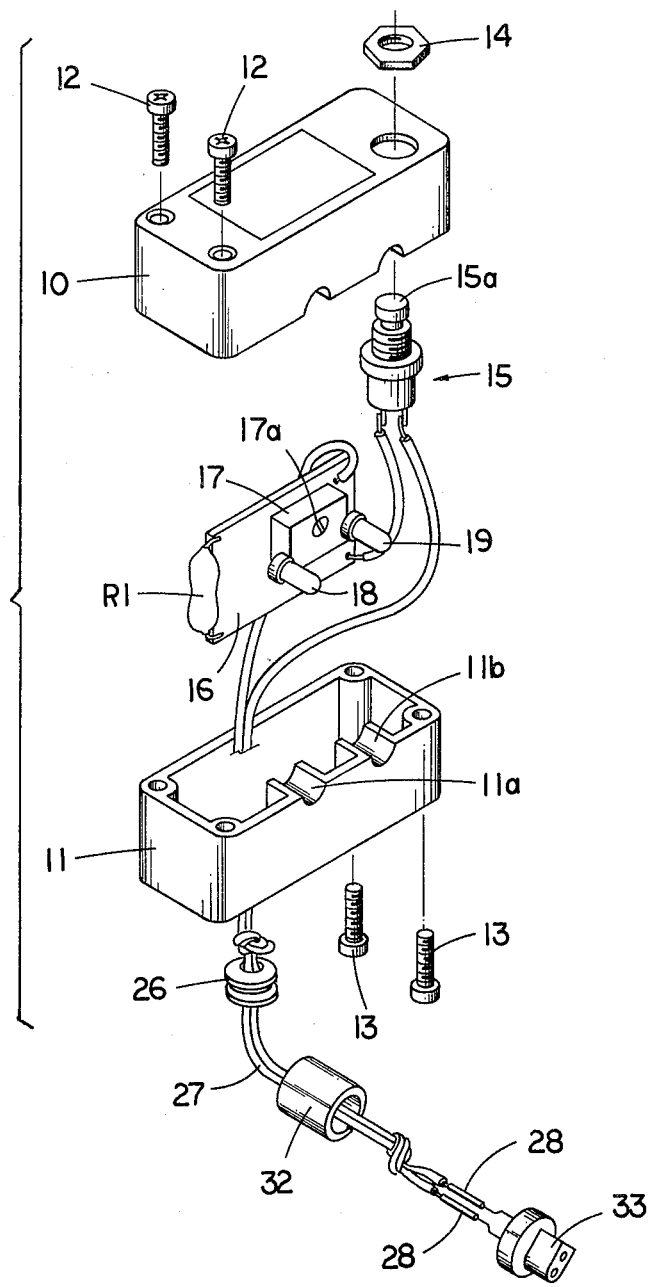
FIG. 1 is an exploded, perspective view of the apparatus of the present invention.

Referring initially to FIG. 1, the apparatus includes two housing halves, the upper housing member being indicated at 10 and the lower housing member being indicated at 11. These housing members are identical but, when assembled, one is inverted with respect to the other. The housing portions are held together by screws 12, accessible from the upper face of the housing, and screws 13, accessible at the lower face of the housing.

Supported on the housing wall by means of the nut 14 is a normally open switch 15, the manually operable push-button 15a of the switch being accessible at the exterior of the housing. Vertically arranged within the housing is a circuit board 16 which supports a load resistor $R_1$. The board also supports a potentiometer 17 having an adjusting screw 17a which functions to adjust the electrical resistance of the potentiometer as will be further referred to with reference to FIG. 2.

Extending from the board 16 are two light emitting diodes 18 and 19 (LED), the diodes being supported in the bosses 11a and 11b respectively in the interior of the housing. The tips of the diodes 18 and 19 are generally flush with the outer face of the housing elements 10 and 11 when assembly is completed. Additional circuit components, not visible in FIG. 1, are present in the assembly, these being more specifically referred to subsequently with reference to FIG. 2.

Extending through a grommet 26 enclosing an aperture in the base of the housing member 11 is a dual conductor cable 27 which is attached to contact pins 28, the pins being housed within a conventional molded plug 33, the cap portion 32 protecting the wire and pin connection. The plug 33 is of conventional type and is adapted to plug directly into the charging receptacle on the battery support portion of the model.

Figure 2:
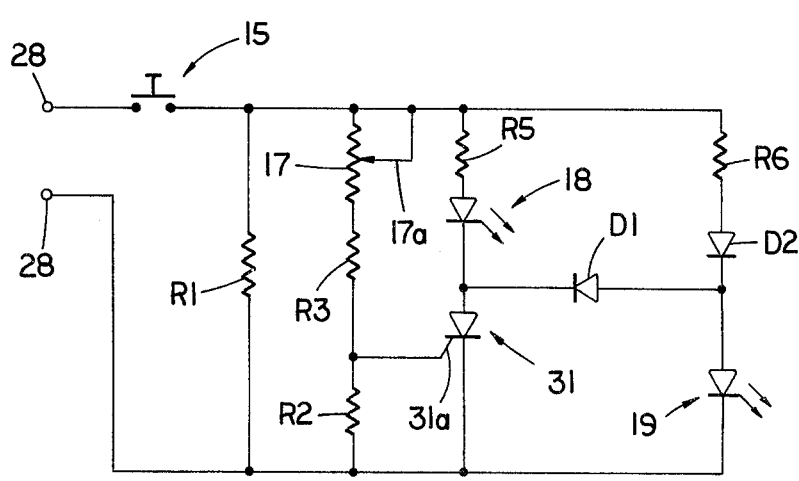
FIG. 2 is a schematic diagram of the electrical circuit of the apparatus shown in FIG. 1.

Referring to FIG. 2, when the plug 33 is inserted in the charging receptacle on the battery pack, the pins 28 are connected across the battery terminals so that a DC voltage of, for example, 4.8 volts (assuming the battery is at rated voltage) is impressed across the pins. Since switch 15 is normally open, the battery potential is not impressed across the circuit components and this functions as a safety factor preventing draining of the battery should the plug 33 be inadvertently left inserted in the charging receptacle of the battery pack for an extended time period. The manually operated switch, when closed, impresses the battery potential across the load resistor $R_1$, which may be a three watt, 22 ohm resistor. The closure of the switch 15 also impresses the battery potential across a voltage divider network composed of potentiometer 17, resistance $R_3$ (which may have a resistance of 5.6 kilohms) and the resistor $R_2$ (which may have a resistance of 1 kilohm). Battery voltage is further impressed across a series connected resistor $R_5$ (which may have a resistance of 15 ohms), a light emitting diode (LED) 18 emitting green light when in the forward conducting state and a silicon controlled rectifier (SCR) 31. The gate 31a of the SCR is connected to the junction between resistor $R_2$ and $R_3$.

Finally, the battery voltage, at the closure of switch 15, is impressed across a series connected first diode $D_2$, resistor $R_6$ (which may have a resistance of 220 ohms) and a light emitting diode 19 which, when conducting in the forward mode, emits red light. A second diode $D_1$ is connected between the junction of the diode $D_2$ with the LED 19 and the junction of the LED 18 with the SCR 31. The diodes $D_1$ and $D_2$ are identical germanium diodes having the identification IN60. A table, setting out the preferred resistance values and identification of the solid state components is below:

| | |
|---|---|
| $R_1$ | 22 ohms 3 watts |
| $R_2$ | 1 k. |
| $R_3$ | 5.6 k. |
| Potentiometer 17 | 2 k. |
| $R_5$ | 15 ohms |
| $R_6$ | 220 ohms |
| LED 18 | FLV-365 |
| LED 19 | FLV-160 |
| SCR 31 | C13Y |
| $D_1$ | IN60 |
| $D_2$ | IN60 |

In operation, referring primarily to FIG. 2, with the plug 33 plugged into the battery charge receptacle (not shown) in a battery pack (assumed to have a rated output of 4.8 volts), 4.8 volts will be impressed across terminals 28. The switch 15 may then be manually closed, and held closed, preferably for approximately 5 seconds. This loads the battery by connecting load resistor $R_1$ across its terminals. The voltage dividing network, made up of resistors 17, $R_3$ and $R_2$, is also connected across the battery being checked. If the battery voltage is 4.6 volts or higher, the voltage drop across $R_2$ is high enough to trigger SCR 31 to the on mode. It will be understood that this trigger-on voltage at the gate of SCR 31 can be adjusted by means of potentiometer 17, the preferable adjustment, for the rated 4.8 volt battery, being that which permits SCR 31 to go to the on or forwardly conducting mode when the battery voltage is 4.6 volts or above.

With SCR 31 in the on mode, the main current path to SCR 31 is through the current limiting resistor $R_5$ and the LED 18, a secondary current path being through current limiting resistor $R_6$ and diodes $D_2$ and $D_1$. This current flow causes the voltage at the junction of $D_2$ and $D_1$ to drop to a level too low to forwardly bias the LED 19 to go to the on mode; the LED 18, in the primary current path will be forwardly biased to on and will emit green light.

After the 15 second interval during which switch 15 is held closed, the switch button is released momentarily and again pressed to close the switch. If the battery is charged or at an acceptable stored energy level, during the 15 second interval when load resistor $R_1$ is across the battery terminals, the battery voltage will not have dropped below the 4.6 volt trigger level. The post-interval reclosing of switch 15 thus again causes SCR 31 to go to the on mode and LED 18 will again emit green light while LED 19 remains off. However, if the battery is weak, the voltage, under the 15 second loading, will drop to less than the critical 4.6 volt triggering value. Upon the momentary closing of switch 15 SCR 31 will not be triggered to the on mode. With SCR 31 off, the voltage level at the $D_2$–$D_1$ junction will initially approach the battery voltage level causing LED 19 to be forwardly biased to the on mode and to emit red light. With LED 19 on, the resulting voltage drop across LED 19 provides a sufficient reverse bias on diode $D_1$ to hold it in the off mode assuring that LED 18 cannot, simultaneously with LED 19 go to the on mode.

Checking the battery with a 15 second closure of the switch 15, then a momentary reclosure, and noting the LED condition during the reclosure, thus provides a means for checking both the voltage and current condition, the energy level, of the battery. If the checker is inadvertently left connected to the battery, as long as switch 15 is not moved to closed position, there is no battery drain. Potentiometer 17 can be factory adjusted (by means of element 17a) to permit the device to be used to check a relatively wide range of rated battery voltages.

While the invention has been disclosed and described in some detail in the drawings and foregoing description, they are to be considered as illustrative and not restrictive in character, as other modifications within the scope of the invention may readily suggest themselves to persons skilled in the art.

I claim:

1. A device for checking the energy level of a battery comprising manually operated switching means, a series connected light emitting diode and a silicon controlled rectifier placed across said battery terminals by said switching means, circuit means for applying a predetermined increment of the battery voltage to the control gate of said rectifier, a series connected first diode and a further light emitting diode also placed across said battery terminals by said switching means, and a second diode connected between the junction of said first mentioned diode with said further light emitting diode and the junction of said first mentioned light emitting diode with said silicon controlled rectifier, whereby if said predetermined increment of battery voltage is of sufficient magnitude said silicon controlled rectifier will go to the on condition forwarding biasing said first mentioned light emitting diode, the current flow through said first and second diodes maintaining the voltage across said further light emitting diode below the forwardly biasing level, and if said predetermined voltage increment is insufficient to produce the on condition in said silicon controlled rectifier said further light emitting diode will be forwardly biased, with the voltage drop across said further light emitting diode providing a reverse bias on said second diode to thus provide a go, no-go visual indication at said light emitting diodes of the voltage level of the battery.

2. A battery checking device as claimed in claim 1 in which a current limiting resistor is placed in series with each of said light emitting diodes.

3. A battery checking device as claimed in claim 1 in which said circuit means comprises a voltage divider network connected across said battery terminals through said switching means, said network including means for adjusting the voltage impressed on said control gate upon energization of the voltage divider network.

4. A battery checking device as claimed in claim 1 in which said first mentioned light emitting diode emits green light when in the forward conducting state and said further light emitting diode emits red light when in the forward conducting state.

5. A battery checking device as claimed in claim 1 but further including a load resistor placed across the battery terminals by said switching means.

* * * * *